United States Patent [19]
Suzuki et al.

[11] Patent Number: 5,663,588
[45] Date of Patent: Sep. 2, 1997

[54] SEMICONDUCTOR DEVICE HAVING AN SOI STRUCTURE OF MESA ISOLATION TYPE AND MANUFACTURING METHOD THEREFOR

[75] Inventors: Megumi Suzuki, Toyota; Kazuhiro Tsuruta, Toyoake; Akiyoshi Asai, Aichi-gun, all of Japan

[73] Assignee: Nippondenso Co., Ltd., Kariya, Japan

[21] Appl. No.: 501,187

[22] Filed: Jul. 11, 1995

[30] Foreign Application Priority Data

Jul. 12, 1994 [JP] Japan .................................. 6-160190

[51] Int. Cl.$^6$ .......................... H01L 29/76; H01L 29/94; H01L 31/062; H01L 31/113
[52] U.S. Cl. .......................... 257/350; 257/354; 257/386
[58] Field of Search .................................. 257/350, 354, 257/386, 409, 295; 437/63, 52

[56] References Cited

U.S. PATENT DOCUMENTS

| | | | |
|---|---|---|---|
| 3,859,716 | 1/1975 | Tihany | 257/354 |
| 4,753,896 | 6/1988 | Matloubian | 257/350 |
| 5,225,704 | 7/1993 | Wakamiya et al. | 257/409 |
| 5,262,672 | 11/1993 | Iranmanesh | 257/386 |
| 5,371,032 | 12/1994 | Nishihara | 437/52 |
| 5,492,857 | 2/1996 | Reedy et al. | 437/63 |
| 5,514,880 | 5/1996 | Nishimura et al. | 257/350 |
| 5,523,964 | 6/1996 | McMillan et al. | 257/295 |

FOREIGN PATENT DOCUMENTS

| | | |
|---|---|---|
| 4-130764A | 5/1992 | Japan . |
| 5-166919 | 7/1993 | Japan . |
| 5167050 | 7/1993 | Japan . |
| 5-175121 | 7/1993 | Japan . |
| 6-5813 | 1/1994 | Japan . |

OTHER PUBLICATIONS

Haond, et al: "Lateral Isolation in SOI CMOS Technology", Solid State Technology, Jul. 1991; pp. 47–52.

*Primary Examiner*—Stuart S. Levy
*Assistant Examiner*—Adriana Giordana
*Attorney, Agent, or Firm*—Cushman, Darby, Cushman IP Group of Pillsbury Madison & Sutro LLP

[57] ABSTRACT

A semiconductor device of SOI structure formed by the mesa isolation method, which can sufficiently reduce the wiring capacitance even if the width of the isolation trench is large. An SOI layer which constitutes an element region is formed by forming a buried oxide film in a silicon substrate, forming an isolation trench in the buried oxide film and burying an isolating material in the isolation trench. By the formation of the SOI layer with the isolating material, a dummy SOI layer is formed in a field part other than the element region. Then, by the formation of a MOSFET gate wiring on the dummy SOI layer, the wiring capacitance is reduced. Furthermore, the dummy SOI layer is completely depleted when the MOSFET threshold value is applied to the gate wiring.

16 Claims, 7 Drawing Sheets

SEMICONDUCTOR DEVICE HAVING AN SOI STRUCTURE OF MESA ISOLATION TYPE AND MANUFACTURING METHOD THEREFOR

CROSS REFERENCE TO RELATED APPLICATION

This application is based upon and claims the benefit of priority of the prior Japanese Patent application No. 6-160190 filed on Jul. 12, 1994, the contents of which are incorporated herein by reference.

BACKGROUND OF THE INVENTION

1. Field of the Invention

The present invention generally relates to a semiconductor device and a manufacturing method for a semiconductor device. More particularly, the present invention relates to a semiconductor device in which an element region is formed in an SOI (silicon on insulator) layer isolated by means of an isolation trench and a MOSFET is formed in the thus formed element region, and a manufacturing method for such semiconductor device.

2. Related Arts

Conventionally, there have been two types of manufacturing methods for a semiconductor device of SOI structure; one method uses a lamination of semiconductor substrates for forming the SOI structure, and the other method uses a SIMOX substrate for forming the SOI structure. In the former method, as disclosed in the Japanese Unexamined Patent Publication No. 5-167050, a $SiO_2$ film is formed on a semiconductor substrate having a rugged surface, the surface of $SiO_2$ formed on the semiconductor substrate is polished and bonded to the other semiconductor substrate, the bonded surface is polished, and thereby an SOI layer having an element region on the rugged surface is formed.

However, this method using a lamination of semiconductor substrates has a problem in that the film thickness of the SOI layer is not uniform due to polishing. In order to solve this problem, some measures should be taken to achieve a uniform polishing such as a provision of a plurality of dummy layers.

In contrast to this method, in the latter method using a SIMOX substrate for forming an SOI layer, oxygen is ion implanted into a semiconductor substrate and thereby a buried oxide film is formed in the semiconductor substrate and an SOI layer is formed as an element region by using the buried oxide film. This method, unlike the method using a lamination of substrates, has an advantage in that the film thickness can be made uniform.

When element isolation is obtained in the method using a SIMOX substrate for forming an SOI layer, the mesa isolation method or the LOCOS isolation method is used. A construction obtained by the mesa isolation method is illustrated in FIG. 9, and a construction obtained by the LOCOS isolation method is illustrated in FIG. 10.

When the mesa isolation method is used, as illustrated in FIG. 9, an SOI layer 13 is formed as an element region by the formation of an isolation trench. In this case, the wiring capacitance between a gate wiring 18 in a field part in which the SOI layer 13 is not formed and a substrate 11 constitutes a series capacitance of a gate oxide film 17 and a buried oxide film 12. Therefore, if the buried oxide film 12 is thin or the buried oxide film 12 becomes thin due to wet etching with hydrofluoric acid in a specific process of manufacturing, a parasitic capacitance C1 becomes large to the disadvantage of high-speed operation as shown in FIG. 11.

FIG. 12 shows that an insulating material 16 such as $SiO_2$ may be buried in the isolation trench. In this case, the wiring capacitance can be reduced due to the buried $SiO_2$. If the width of the isolation trench is large, however, the isolating material can not be deposited so thick in the central part of the trench and results in a structure illustrated in FIG. 12, and the above problem that the wiring capacitance increase can not be solved.

On the other hand, when isolation is obtained by the LOCOS isolation method, the problem caused by the mesa isolation method can be solved. Usually, however, because an oxide film layer, which is called "bird's beak," extending in the transverse direction is formed in the peripheral part of the SOI layer 13, the width of the isolation region should be made larger than the width by the mesa isolation method, and this poses a problem of low integration degree. Therefore, for higher integration degree, the mesa isolation method is more effective.

SUMMARY OF THE INVENTION

In view of the above problems, it is an object of the present invention to sufficiently reduce the wiring capacitance even if the width of the isolation trench is large in a semiconductor device having an SOI structure of mesa isolation type formed by using isolation trenches.

In order to achieve the above objective, a semiconductor device according to the present invention comprises an island of a monocrystalline semiconductor layer disposed on a surface of a semiconductor substrate with an insulating layer interposed therebetween, a semiconductor element formed in the monocrystalline semiconductor layer, a wiring line extended on a field part surrounding the monocrystalline semiconductor layer for supplying a specified electric potential to the semiconductor element, and a dummy monocrystalline semiconductor layer disposed in the field part at least under the wiring line and between the wiring line and the insulating layer so as to have a thickness equal to or smaller than a film thickness for complete depletion at the specified electric potential.

Here, the semiconductor element can be an MOSFET which can use the wiring line as the gate wiring thereof, perform ON operation at the specified electric potential, and the channel region thereof can completely and fully be depleted.

The dummy monocrystalline semiconductor layer may be formed by being divided by a plurality of isolation trenches. In this case, it is preferable that an insulating material having a smaller dielectric constant than the dielectric constant of the monocrystalline semiconductor layer might be buried in the isolation trench.

On the other hand, a manufacturing method according to the present invention comprises a step of forming a monocrystalline semiconductor layer on a semiconductor substrate through an insulating layer, a step of forming an isolation trench in the monocrystalline semiconductor layer to divide the monocrystalline semiconductor layer between a first monocrystalline semiconductor layer and a second monocrystalline semiconductor layer, a step of forming a wiring layer extending to the first monocrystalline semiconductor layer through the second monocrystalline semiconductor layer, and a step of forming a circuit element using the wiring layer as an electrode in the first monocrystalline semiconductor layer and casting the second monocrystalline semiconductor layer as a dummy monocrystalline semiconductor layer in which the circuit element is not formed.

Here, the step of forming the isolation trench may include a step of forming a plurality of trenches in the second monocrystalline semiconductor layer, and thus dividing the dummy monocrystalline semiconductor layer into plurality of portions. In this case, it is preferable that a step of filling the trenches with an insulating material having a smaller dielectric constant than the dielectric constant of the monocrystalline semiconductor layer might be added.

According to the present invention, an isolation trench is formed in a monocrystalline semiconductor layer formed on an insulating layer to reach the insulating layer, an element region is formed on the monocrystalline semiconductor layer to be isolated by the insulating layer and the isolation trench, and a circuit element is formed in the element region. Here, a dummy monocrystalline semiconductor layer is formed at least under a wiring line extending to the circuit element so as to be located under a field part outside of the element region.

Accordingly, even if the interval between the adjacent element regions is wide, the dummy monocrystalline layer is formed between the adjacent element regions. As a result, the dummy monocrystalline semiconductor layer is disposed under the wiring line in the field part, and as compared with the conventional structures illustrated in FIGS. 11 and 12, the wiring capacitance can be reduced and the operating speed of the circuit can be raised.

Particularly, if the wiring line is used as a gate wiring of a MOSFET formed in the element region, the operating speed of the MOSFET can be raised.

Here, an important fact is that the dummy monocrystalline semiconductor layer is so set as to be completely depleted when an electric potential is applied to the wiring line. Therefore, when the circuit element such as a MOSFET is in operation, i.e., a gate electric potential being applied, the increase in the capacitance of the dummy monocrystalline semiconductor layer can be prevented and the wiring capacitance in an operation state can be reduced further.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Hereinafter, the present invention illustrated in the appended drawings will be described.

[First Embodiment]

Figure 1A:
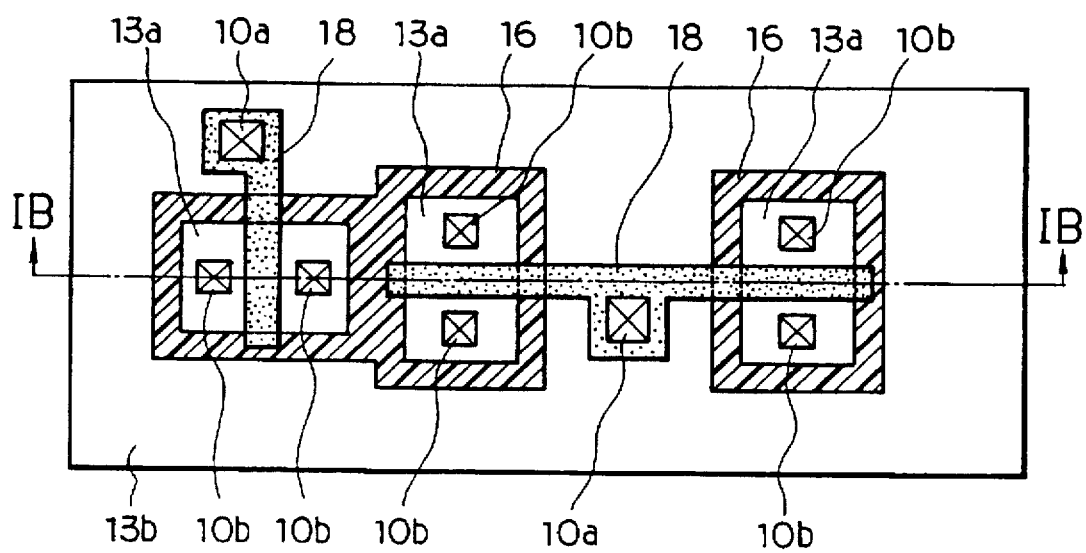
FIG. 1A is a plan view of a semiconductor device according to a first embodiment of the present invention.
Figure 1B:
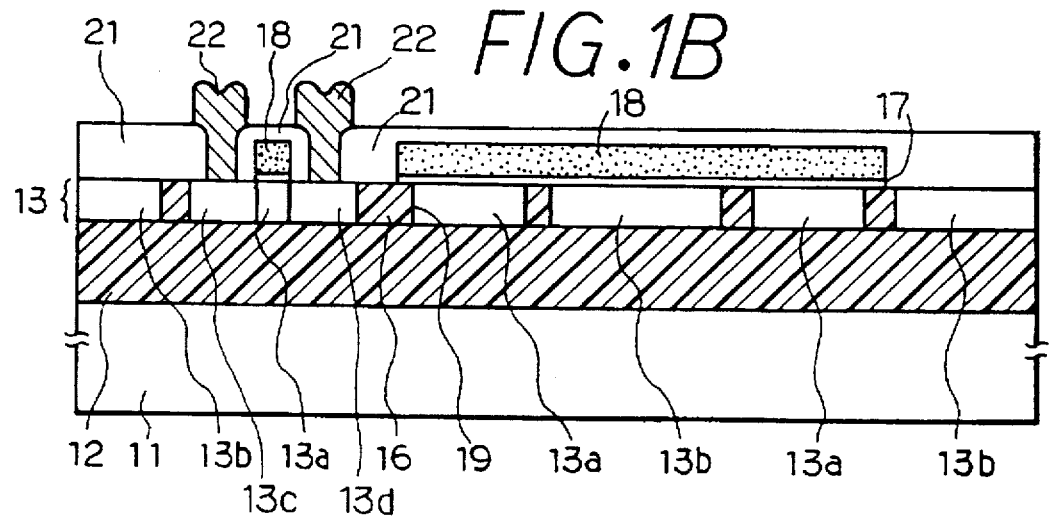
FIG. 1B is a cross-sectional view taken along line IB—IB of FIG. 1A.

FIG. 1A is a plan view of a semiconductor device of fully-depletion type according to the first embodiment of the present invention. FIG. 1B is a cross-sectional view taken along line IB—IB of FIG. 1A.

In FIG. 1B, a buried oxide film 12 is formed on a silicon substrate 11, and a thin monocrystalline silicon layer (SOI layer) 13 is formed on the oxide film 12. An isolation trench 19 is formed in the SOI layer 13, and an insulating material such as $SiO_2$ is buried in the isolation trench 19. The formation of the isolation trench 19 divides the SOI layer 13 into an SOI layer 13a in which a MOSFET is formed and a dummy SOI layer 13b in which a MOSFET is not formed.

As illustrated in FIG. 1A, this isolation trench 19 is formed in the peripheral part of the SOI layer 13a in which the MOSFET is formed as if to surround the SOI layer 13a. A gate wiring 18 for the MOSFET (made of polycrystalline silicon) formed on the SOI layer 13a is formed as an extension from a gate electrode pad 10a, and under the gate wiring 18 is positioned the dummy SOI layer 13b with a gate oxide film 17 interposed therebetween.

The SOI layer 13 is formed to a thickness smaller than the maximum width of the depletion layer created in the channel region of the MOSFET, the thickness being sufficient for the SOI layer 13a to be completely and fully depleted when an inversion layer is formed.

Here, "when an inversion layer is formed" refers to the time when a channel is formed by an application of the threshold voltage of the MOSFET to the gate wiring 18. Also, the "MOSFET of fully-depletion type" refers to means a MOSFET in which the depletion layer fills the overall channel region when the channel is formed but does not mean a MOSFET in which the overall channel region is not depleted unless a higher gate voltage is applied after the formation of the channel.

In addition, in FIG. 1B, 13c denotes a source layer and 13d denotes a drain layer, and the diffusion depths of the source layer 13c and drain layer 13d from the surface of the SOI layer 13a reach the buried oxide film 12. Also, 21 denotes an interlayer insulating film, 22 denotes an Al source/drain wiring, and 10b denotes a source/drain electrode pad of the MOSFET.

It should be noted here that the width X of the isolation trench 19 is set to a value of less than 3×L, where L is the processible limit dimension of the semiconductor device applicable to the manufacturing process thereof. Therefore, only when the distance between the respective plurality of SOI layers 13a which are to be element regions is 3×L or longer, the dummy SOI layer 13b can be disposed between the respective SOI layers 13a through the isolation trench 19 therebetween.

Furthermore, in this embodiment, as a SIMOX substrate is used, the film thickness of the SOI layer is uniform.

According to the construction of this embodiment as described above, within the regions other than the SOI layers 13a which are supposed to be element regions are formed dummy SOI layers 13b with the isolation trench 19 having the width X interposed therebetween. Therefore, the width X of the isolation trench can be reduced to the processible limit dimension by mesa etching, the film thicknesses between the element regions (field parts) can be maintained to be large, and the parasitic capacitance of the gate wiring 18 can be reduced.

Figure 2:
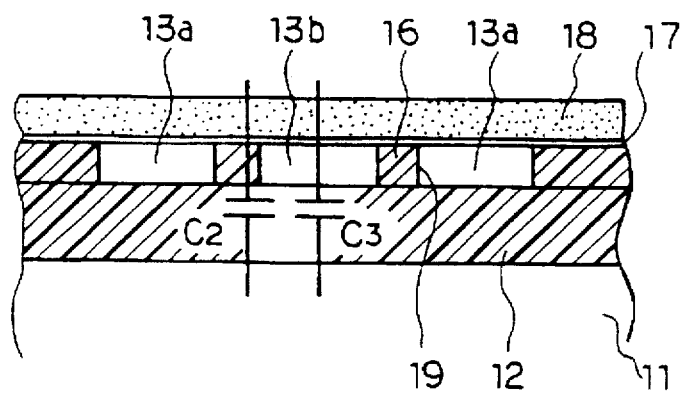
FIG. 2 is a view depicting the capacitance of the gate wiring of the first embodiment shown in FIG. 1.
Figure 11:
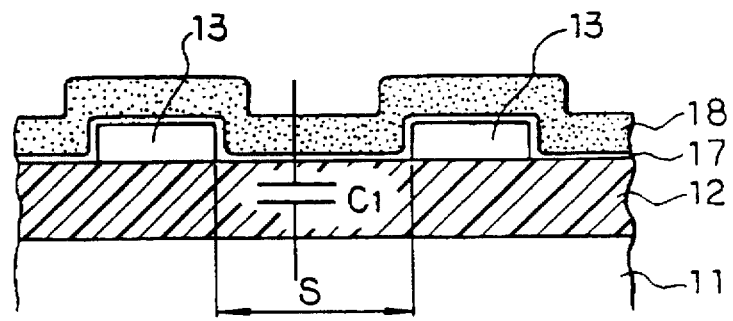
FIG. 11 is a view depicting the capacitance of the gate wiring of SOI structure formed by means of the mesa isolation method.
Figure 12:
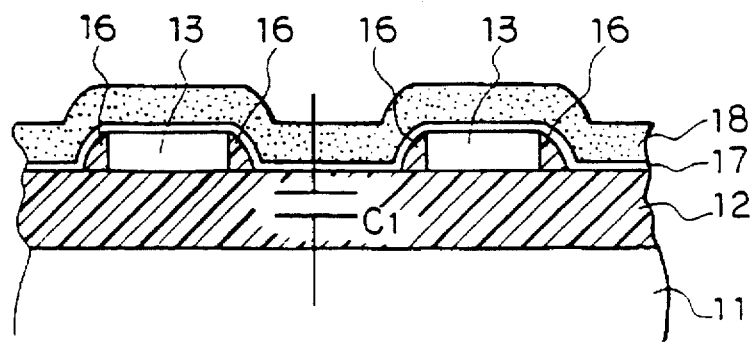
FIG. 12 is a view illustrating a structure in which an isolating film is buried in an isolation trench to depict a problem which may occur if the width of the isolation trench is larger as compared with the structure of FIG. 11.

To be specific, as illustrated in FIG. 2, when the wiring capacitance with the insulating material 16 buried in the isolation trench 19 is C2, C2<C1 (C1: see FIG. 11) is established. Furthermore, when the semiconductor device is in operation, as the dummy SOI layer 13b is completely depleted, the capacitance C3 is expressed as $C3^{-1}=C1^{-1}+CD^{-1}$, and therefore C3<C1 is established, and an increase in the capacitance can be prevented, where CD is the capacity when the dummy SOI layer 13b has completely been depleted.

According to this embodiment as described above, the integration degree can be raised since the mesa isolation is performed on the SIMOX substrate, and furthermore high-speed operation can be achieved by a reduction of the wiring capacitance.

A technique to flatten the element surface for use in the formation of a gate wiring is disclosed in the Japanese Unexamined Patent Publication No. 5-166919. According to this technique, a source/drain layer is formed on the surface within a semiconductor layer formed on a substrate, a gate electrode is formed on the semiconductor layer interposing a gate insulating film therebetween, and a wiring layer connected to the gate electrode is formed on a semiconductor layer for wiring flattened to the film thickness of the semiconductor layer, and thereby the device surface is flattened. However, in the semiconductor device disclosed in the Japanese Unexamined Patent Publication No. 5-166919, the film thickness of the semiconductor layer for wiring is far larger than the diffusion depth of the source/drain layer. In the semiconductor device of such construction, when voltage is applied to the gate electrode and the wiring layer, a dummy semiconductor layer located under the wiring layer is depleted only in the surface, and the semiconductor layer for wiring located at a region deeper than the surface has some parts which are left not depleted. When a wiring capacitance is formed between the wiring layer and the substrate, the wiring capacitance is subject to a slight decrease due to the disposition of the semiconductor layer for wiring. The dummy semiconductor layer located under the wiring layer that is not subject to a complete depletion, however, cannot sufficiently reduce the wiring capacitance. It may be possible to apply a gate voltage higher than the voltage applied in normal operation to the gate electrode for achieving a complete depletion. If too high a gate voltage is applied to the gate electrode, however, dielectric breakdown may occur through the gate insulating film and consequently the transistor itself may be damaged. In order to reduce the wiring capacitance and achieve the high-speed operation of the device, it is important that the thickness and impurity concentration of the dummy semiconductor layer located under the wiring layer should be so designed as to completely be depleted when an electric potential is applied to the wiring layer.

Next, an example of the manufacturing method for the semiconductor device having the structure according to this embodiment will be described.

FIGS. 3A through 3F are process views illustrating the manufacturing method for the semiconductor of FIG. 1. Now, the manufacturing method will be described along the flow of the processes.

Figure 3A:
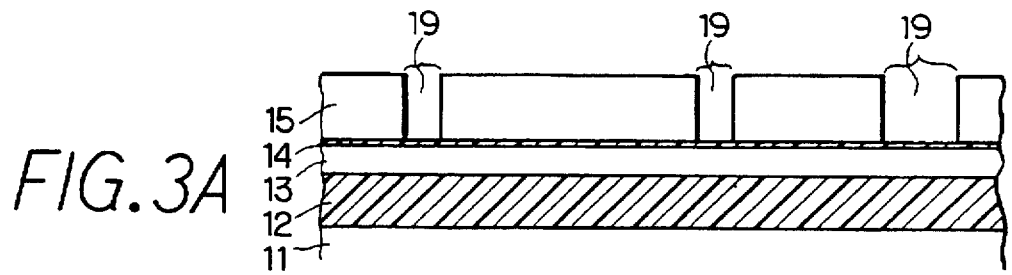
FIGS. 3A, 3B, 3C, 3D, 3E and 3F are cross-sectional views showing the manufacturing method of the semiconductor device according to the first embodiment.

The buried oxide film 12 is formed on the silicon substrate 11 by the SIMOX method, and an oxide film 14 and a nitride film 15 are formed on the surface of the SOI layer 13 formed on the buried oxide film 12. Then, as illustrated in FIG. 3A, the nitride film 15 is selectively etched and thereby the isolation trench 19 is formed. In this process, the width X of the isolation trench 19 is so set as to be $L \leq X \leq 3L$, where L is the processible limit dimension.

Figure 3B:
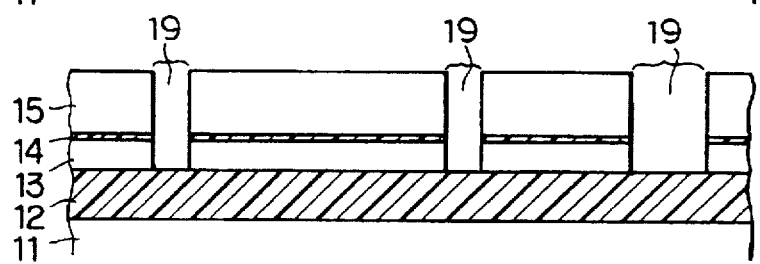

Next, as illustrated in FIG. 3B, the oxide film 14 and the SOI layer 13 are etched by using the nitride film 15 as a mask.

Figure 3C:
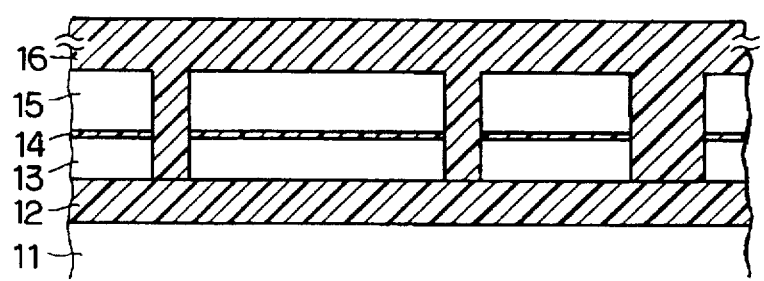

Following the above, the insulating material 16 such as $SiO_2$ is deposited thick all over as shown in FIG. 3C. As an insulating material, SiN, a combination of SiN and $SiO_2$, etc. may be used as well as $SiO_2$. Here, the film thickness of the deposition should be ½ or more of the maximum width of a trench in which the insulating film 16 is buried.

Figure 3D:
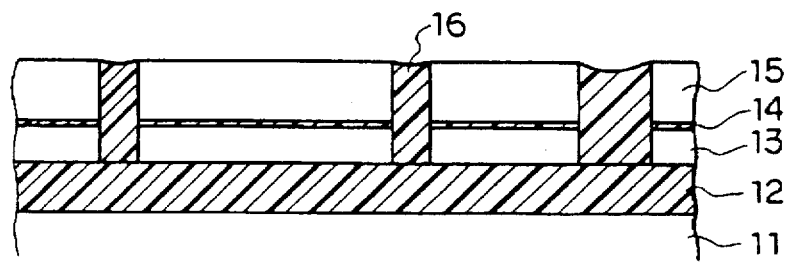

Then, as illustrated in FIG. 3D, the insulating material 16 is etched back by using the nitride film 15 as an etching stopper. As a result, the insulating material 16 is left thick in the isolation trench 19, and therefore etching damage, if any, will not directly affect the surface of the SOI layer 13.

Figure 3E:
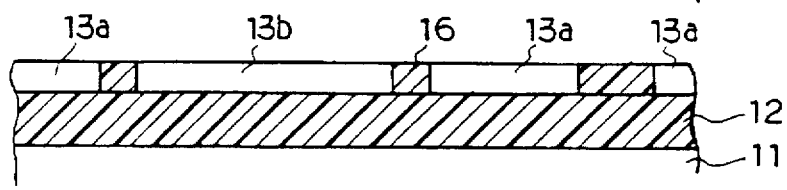

The next step is, as illustrated in FIG. 3E, to remove the nitride film 15 and the oxide film 14 by using wet etching with hydrofluoric acid. As the insulating material 16 is left thick in the process illustrated in FIG. 3D, even after the treatment with hydrofluoric acid, the insulating material 16 can maintain the thickness sufficient to fill the trench between islands of the SOI layer 13.

Under some etching conditions, the insulating film 16 is protruded out of the surface of the SOI layer 13a or 13b. In this case, however, as the protrusion of the insulating film 16 can evade the occurrence of electric field concentration or parasitic transistor in an edge part of the SOI layer 13a or 13b, the protrusion of the insulating film 16 may be preferable.

Also, as the dummy SOI layer 13b is disposed on the field part, the buried oxide film 12 under the dummy SOI layer 13b is protected from etching during the wet etching process with hydrofluoric acid.

Figure 3F:
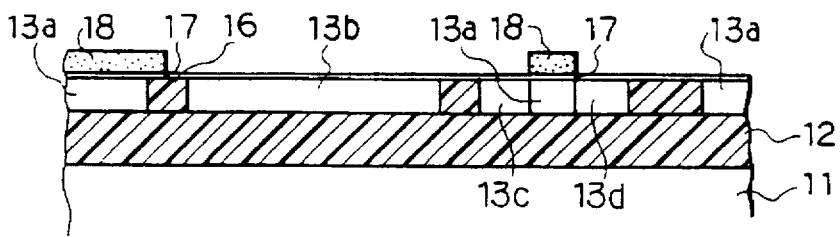
Figure 4:
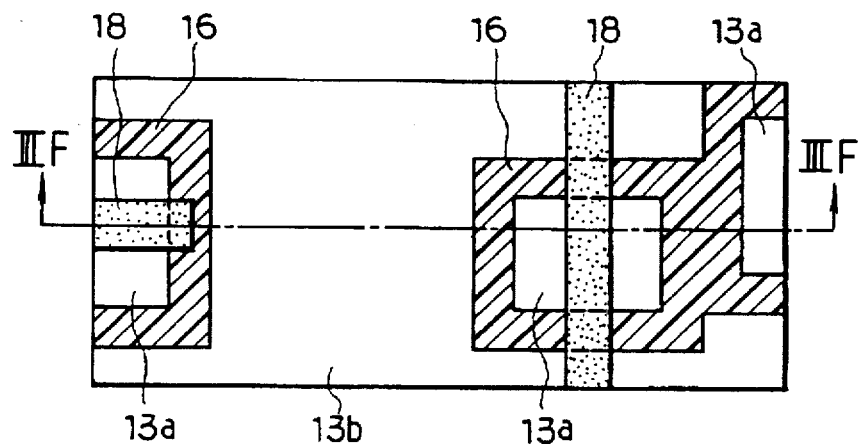
FIG. 4 is a plan view illustrating the semiconductor device of FIG. 3F.

Then, as illustrated in FIG. 3F, by performing the normal MOS process, the gate oxide film 17 is formed and the gate wiring 18 is formed, the source layer 13c and the drain layer 13d are formed in the SOI layer 13a, and the interlayer insulating film 21 and the Al wiring 22 are formed. FIG. 4 is a top view of the semiconductor device formed as described above illustrating the construction thereof. A cross-sectional view taken along line IIIF—IIIF of FIG. 4 is illustrated in FIG. 3F.

In the above manufacturing method, if the impurity concentration of the SOI layer 13a is set so that the dummy SOI layer 13b can be completely depleted or the SOI layer 13b is masked with a resist or the like so that the dummy SOI layer 13b can not be ion implanted during the ion implantation process for the source/drain formation, etc., the impurity concentration of the dummy SOI layer 13b can remain low and the complete depletion of the dummy SOI layer 13b can be achieved.

Figure 13:
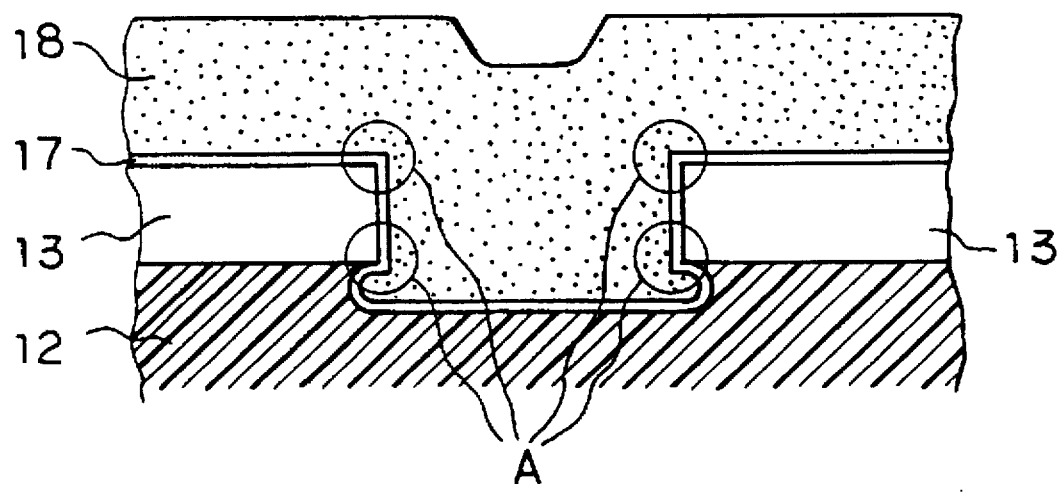
FIG. 13 is a view for use in depicting a problem which may occur if the insulating material is not buried in the isolation trench.

In the above manufacturing method, however, unless the insulating material 16 is formed by being buried in the isolation trench 19, a shape illustrated in FIG. 13 will be formed, that is, upper and lower corner parts A of the SOI layer 13 will be exposed and the gate oxide film 17 and the gate electrode 18 will be formed thereon, in the wet etching process illustrated in FIG. 3E. If this shape is formed, such a problem as the degradation in withstanding voltage of the gate oxide film 17 due to the electric field concentration at the corner parts A or the increase in leakage current due to parasitic transistor at the corner parts A will be caused. Therefore, by burying the insulating material 19 in the isolation trench 19, the parasitic capacitance of the wiring can be reduced and such problem as described above can be prevented.

[Second Embodiment]

Figure 5:
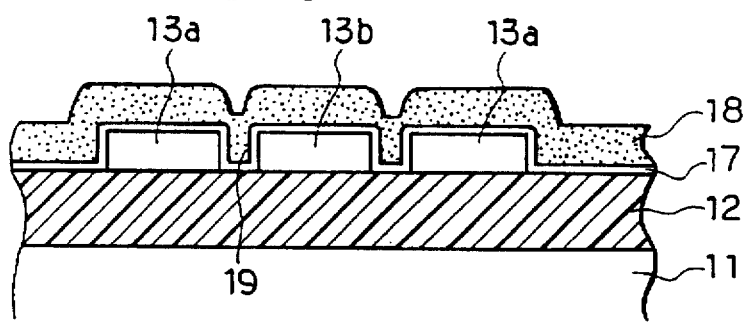
FIG. 5 is a cross-sectional view of a semiconductor device according to a second embodiment of the present invention.

FIG. 5 illustrates the second embodiment according to the present invention.

This embodiment is different from the first embodiment in that the insulating material 16 is not buried in the isolation trench 19. Over the surfaces and sides of the SOI layers 13a and 13b is formed the gate wiring 18 interposing the gate oxide film 17 therebetween. In this embodiment, as compared with the first embodiment, the parasitic capacitance increases as much as the buried insulating material 16 that is not provided in this embodiment. Compared with the conventional structure with mesa isolation, however, as this embodiment has the dummy SOI layer 13b, the parasitic capacitance can be reduced. It should be noted that the width of the isolation trench 19 be set to be sufficiently narrow with respect to the width of the dummy SOI layer 13b.

[Third Embodiment]

Figure 6:
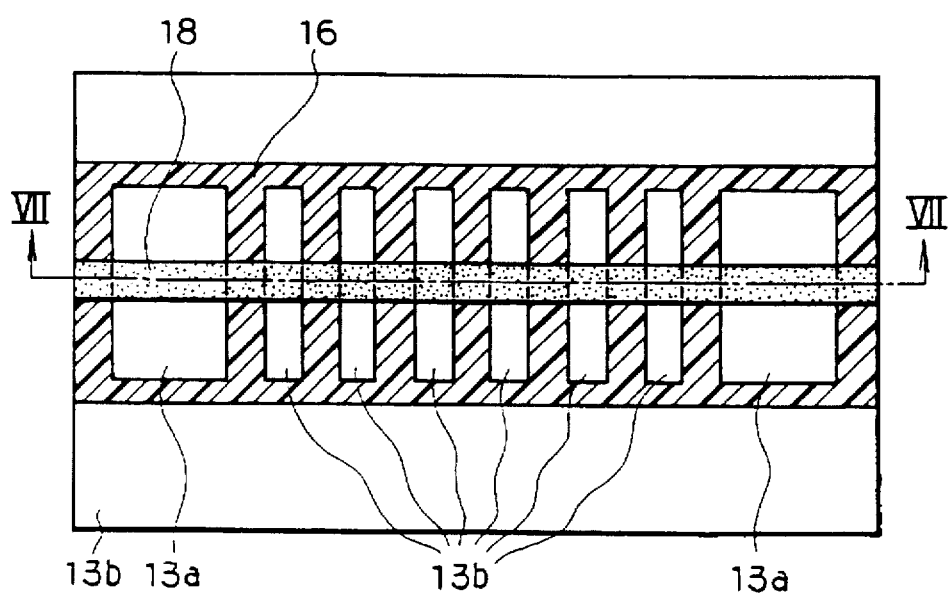
FIG. 6 is a plan view of a semiconductor device according to a third embodiment of the present invention.

In the third embodiment, as illustrated in FIG. 6, at least the region located under the gate wiring 18 is divided into the plurality of dummy SOI layers 13b.

According to the structure of this embodiment, the $SiO_2$ region in the region under the gate wiring 18 increases as compared with the structure of the first embodiment. As $SiO_2$ is smaller in dielectric constant than silicon, this embodiment can further reduce the parasitic capacitance from that of the first embodiment. In this case, the width of the insulating material 16 located under the gate wiring 18 and the width of the dummy SOI layer 13b are X respectively, and X is set so as to be within a range of L<X<3L, where L is the processible limit dimension.

Figure 7A:
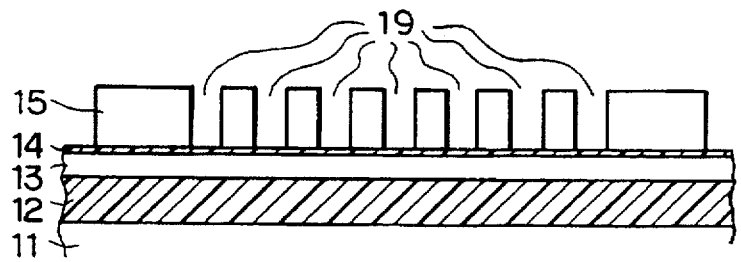
FIGS. 7A, 7B, 7C, 7D, 7E and 7F are cross-sectional views taken along line VII—VII of FIG. 6, which show the manufacturing method of the semiconductor device according to the third embodiment.
Figure 7B:
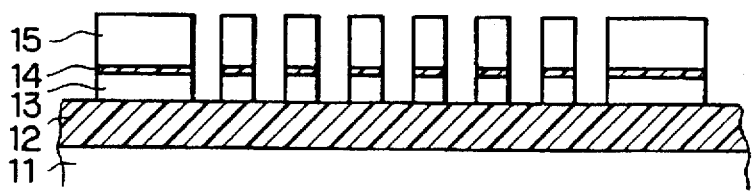
Figure 7C:
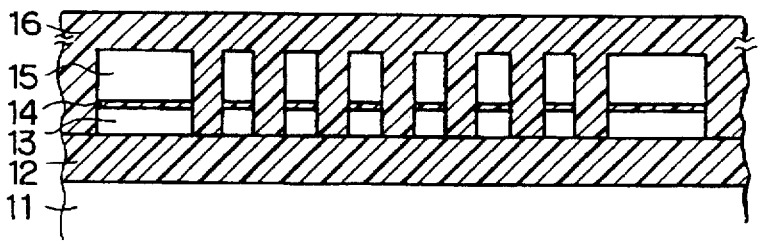
Figure 7D:
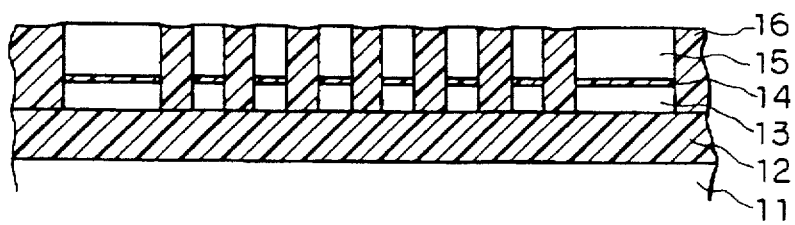
Figure 7E:
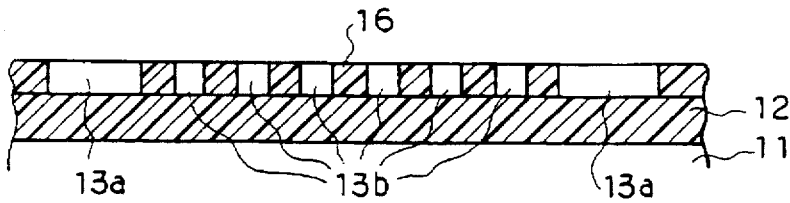
Figure 7F:
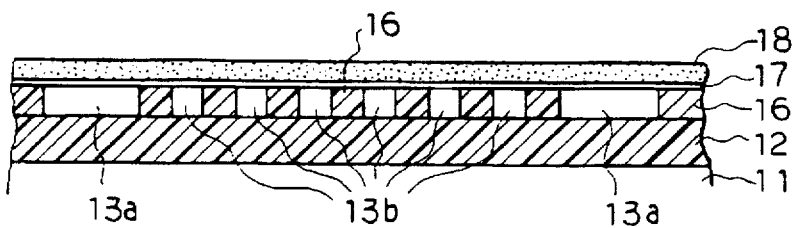

The manufacturing method of the third embodiment is illustrated in FIGS. 7A through 7F. Basically, the manufacturing method of the third embodiment is the same as that of the first embodiment illustrated in FIGS. 3A through 3F excepting that the SOI layer 13 in the region of the field part on which the gate wiring 18 is to be formed is etched into a plurality parts with each width X as illustrated in FIG. 7A and obtain the dummy SOI layers 13b divided into a plurality of parts in a manufacturing stage illustrated in FIG. 7F.

[Fourth Embodiment]

Figure 8A:
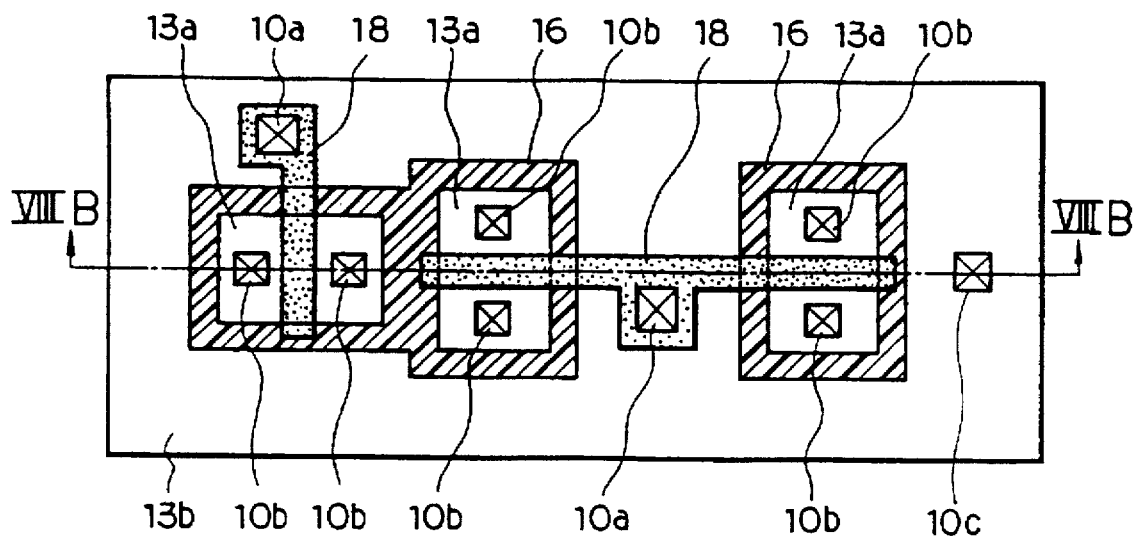
FIG. 8A is a plan view of a semiconductor device according to a fourth embodiment.
Figure 8B:
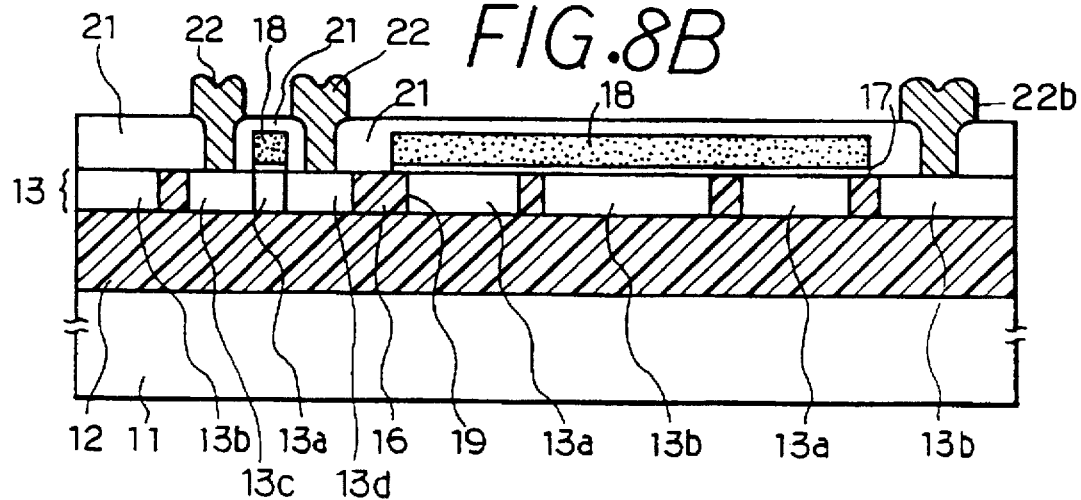
FIG. 8B is a cross-sectional view taken along line VIIIB—VIIIB of FIG. 8A.
Figure 9:
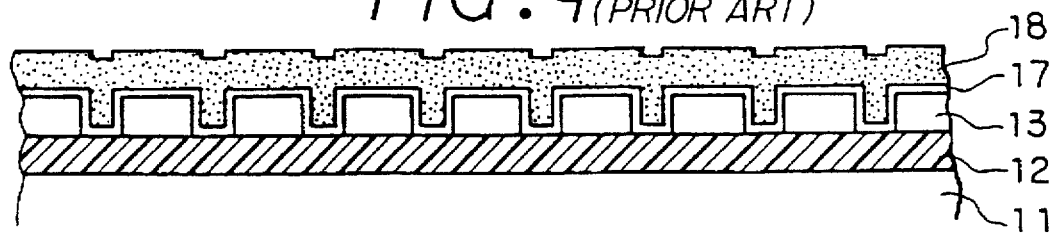
FIG. 9 is a cross-sectional view of a semiconductor device of SOI structure formed by means of the conventional mesa isolation method.
Figure 10:
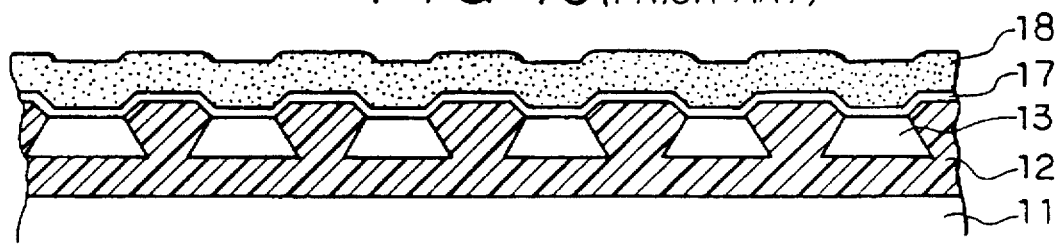
FIG. 10 is a cross-sectional view of a semiconductor device of SOI structure formed by means of the conventional LOCOS isolation method.

The fourth embodiment is illustrated in FIGS. 8A and 8B. FIG. 8A is a plan view of a semiconductor device according to the fourth embodiment, and FIG. 8B is a cross-sectional view taken along line VIIIB—VIIIB of FIG. 8A. This embodiment is different from the first embodiment in that an Al wiring 22b is connected to the dummy SOI layer 13b through a contact hole 10c. The Al wiring 22b is further connected to a specific terminal (e.g., earth $V_{SS}$ terminal, power source $V_{DD}$ terminal). As a result, the electric potential of the dummy SOI layer 13b can be fixed to a specific level of electric potential, which can prevent electric charge from being accumulated in the dummy SOI layer 13b during the operation of the semiconductor device and thereby prevent electric charge from affecting the operation of the semiconductor device. It is of course that the electric potential fixing wiring 22b of the dummy SOI layer 13b can also be applied to the structure described in the second or third embodiment.

In the above-described various embodiments, although MOSFET is used as a circuit element to be formed in the SOI layer 13a, bipolar transistor, diode, etc. may be used instead of MOSFET.

Furthermore, when the dummy layers are arranged at regular intervals as is the case with the technique disclosed in the Japanese Unexamined Patent Publication No. 5-167050, the dummy layers should be arranged by means of handwriting or coordinate calculation. According to the top structure (i.e., circuit elements and isolation trenches surrounding the circuit elements) of the present invention, however, the pattern can easily be designed by a simple data processing using CAD.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:
   a semiconductor substrate;
   an insulating layer formed on a surface of said semiconductor substrate;
   a monocrystalline semiconductor layer disposed on said insulating layer;
   a semiconductor element formed in said monocrystalline semiconductor layer;
   a dummy monocrystalline semiconductor layer in which no devices are formed disposed on said insulating layer so as to be separated from said monocrystalline semiconductor layer by a trench for isolation formed therebetween, said dummy monocrystalline semiconductor layer having a thickness no greater than a thickness such that complete depletion of the layer can be achieved at a specified electric potential; and
   a wiring line provided on both said monocrystalline semiconductor layer and said dummy monocrystalline semiconductor layer, said wiring line for supplying said specified electric potential to said semiconductor element.

2. A semiconductor device according to claim 1, wherein: said semiconductor element is a MOSFET including:
   a source region,
   a drain region, and
   a channel region;
   said wiring line is a gate wiring line for forming an inversion layer in said channel region of said MOSFET, said wiring line being provided on both said monocrystalline semiconductor layer and said dummy monocrystalline semiconductor layer with an insulating film interposed between said wiring line and said layers; and
   said channel region of said MOSFET is fully depleted when said specified electric potential is applied to said gate wiring line.

3. A semiconductor device according to claim 1, wherein:
   at least two monocrystalline semiconductor layers are deposited on said insulating layer; and
   a plurality of dummy monocrystalline semiconductor layers isolated from each other by trenches formed therearound are disposed on said insulating layer between said two monocrystalline semiconductor layers.

4. A semiconductor device according to claim 3, wherein:
an isolating material having a first dielectric constant smaller than a second dielectric constant of at least one of said at least two monocrystalline semiconductor layers is filled in said trenches.

5. A semiconductor device according to claim 1, wherein:
isolating material having a first dielectric constant smaller than a second dielectric constant of said monocrystalline semiconductor layer is filled in said trench for isolation.

6. A semiconductor device comprising:
a semiconductor substrate;
a monocrystalline semiconductor layer disposed on a surface of said semiconductor substrate with an insulating layer interposed therebetween;
an isolation trench formed in said monocrystalline semiconductor layer and extending to said insulating layer;
an element region provided in said monocrystalline semiconductor layer and isolated by said insulating layer and said isolation trench, said element region including a full-depletion type MOSFET comprising:
a source layer formed in said element region and having a diffusion depth reaching said insulating layer,
a drain layer formed in said element region at a specified interval from said source layer and having a diffusion depth reaching said insulating layer, and
a gate electrode, for forming an inversion layer in a channel region disposed between said source layer and said drain layer when a gate electric potential is applied thereto, said gate electrode being formed on said element region with a gate insulating film interposed therebetween;
a dummy layer composed of a monocrystalline semiconductor layer, disposed in a region independent of said element region on said insulating layer, said dummy layer having a thickness substantially equal to a thickness of said element region; and
a wiring layer disposed on said dummy layer with a dummy insulating film interposed therebetween, said wiring layer being electrically connected to said gate electrode.

7. A semiconductor device according to claim 6, wherein:
said element region and said dummy layer are formed of said monocrystalline semiconductor layer so as to be isolated from each other by said isolation trench.

8. A semiconductor device according to claim 6, wherein:
said channel region has a depletion layer extending area in a region deeper than said inversion layer, said depletion layer extending area having such a thickness that said depletion layer reaches said insulating layer when said gate electric potential is applied to said gate electrode; and
said thickness of said dummy layer is substantially equal to said thickness of said depletion layer extending area.

9. A semiconductor device according to claim 6, wherein:
said gate electrode operates said MOSFET with an external application of said gate electric potential thereto via said wiring layer;
said dummy layer is depleted by said gate electric potential applied to said wiring layer; and
said dummy layer has an impurity concentration which makes said dummy layer fully depleted.

10. A semiconductor device according to claim 6, wherein:
said dummy layer and said element region have a same thickness;
said gate insulating film and said dummy insulating film have a same thickness; and
a depletion layer created in said channel region and a depletion layer created in said dummy layer have substantially a same thickness.

11. A semiconductor device according to claim 6, wherein said dummy layer comprises:
a plurality of monocrystalline semiconductor layers isolated from each other by a dummy isolation trench extended to said insulating layer.

12. A semiconductor device according to claim 6, wherein:
an insulating material having a first dielectric constant smaller than a second dielectric constant of said monocrystalline semiconductor layer is filled in said isolation trench.

13. A semiconductor device according to claim 11, wherein:
an insulating material having a first dielectric constant smaller than a second dielectric constant of said monocrystalline semiconductor layer is filled in said dummmy isolation trench.

14. A semiconductor device according to claim 6, further comprising:
a dummy electrode electrically connected to said dummy layer; and
an external connection terminal for electrically connecting said dummy electrode to an outside device.

15. A semiconductor device according to claim 14, wherein:
said external connection terminal is provided with one of a ground electric potential and a power source electric potential.

16. A semiconductor device comprising:
a semiconductor substrate;
a monocrystalline semiconductor layer formed on a surface of said semiconductor substrate with an insulating layer interposed therebetween;
an isolation trench formed in said monocrystalline semiconductor layer to reach said insulating layer, said isolation trench partitioning said monocrystalline semiconductor layer into an element region and a dummy layer;
a source/drain region formed in said element region;
a gate electrode formed on said element region with a gate insulating film interposed therebetween, said gate electrode for forming a depletion layer in said element region which reaches said insulating layer and an inverted channel region when a gate electric potential is applied thereto; and
a wiring layer formed on said dummy layer with a dummy insulating film interposed therebetween, said wiring layer being electrically connected to said gate electrode, and said dummy insulating film having a film thickness equal to a film thickness of said gate insulating film;
a thickness of said monocrystalline semiconductor layer being no greater than a thickness of said depletion layer.

* * * * *